(12) United States Patent
Ando et al.

(10) Patent No.: US 8,274,358 B2
(45) Date of Patent: Sep. 25, 2012

(54) MULTIDIRECTIONAL INPUT MEMBER AND ELECTRICAL DEVICE HAVING SAME

(75) Inventors: Hitoshi Ando, Saitama (JP); Brian St. Jacques, Newark, CA (US); David Moe, Newark, CA (US)

(73) Assignee: Shin-Etsu Polymer Co., Ltd. (JP)

( * ) Notice: Subject to any disclaimer, the term of this patent is extended or adjusted under 35 U.S.C. 154(b) by 280 days.

(21) Appl. No.: 12/818,401

(22) Filed: Jun. 18, 2010

(65) Prior Publication Data

US 2011/0309908 A1 Dec. 22, 2011

(51) Int. Cl.
*H01C 10/10* (2006.01)

(52) U.S. Cl. ............ 338/47; 338/99; 338/114; 200/512; 345/157

(58) Field of Classification Search .................. 200/1 R, 200/512

See application file for complete search history.

(56) References Cited

U.S. PATENT DOCUMENTS

| 6,437,682 | B1* | 8/2002 | Vance | 338/185 |
| 6,750,408 | B2* | 6/2004 | Inoue et al. | 200/6 A |
| 6,841,743 | B2* | 1/2005 | Okada et al. | 200/6 A |
| 6,859,048 | B2* | 2/2005 | Okada et al. | 324/681 |
| 7,078,633 | B2* | 7/2006 | Ihalainen | 200/6 A |
| 7,417,199 | B2* | 8/2008 | Nielsen | 200/5 E |

FOREIGN PATENT DOCUMENTS

WO  WO 00/72333 A1  11/2000

* cited by examiner

*Primary Examiner* — Kyung Lee
(74) *Attorney, Agent, or Firm* — Harness, Dickey & Pierce, P.L.C.

(57) ABSTRACT

A multidirectional input member according to the present invention includes a base plate on which a looped sensor that includes a plurality of groups of non-contacting electrodes configured in a loop is formed and an operation plate locating opposite to the base plate. The operation plate has a first loop-shaped protrusion that is located at a plane opposite to the base plate, that is protruded toward the base plate side, that is opposite to the looped sensor, and that is configured with a resistant rubber member. The first protrusion has a configuration in which its sectional area of a plane parallel to the base plate is tapered in the direction from the operation plate side toward the base plate side.

10 Claims, 14 Drawing Sheets

MULTIDIRECTIONAL INPUT MEMBER AND ELECTRICAL DEVICE HAVING SAME

TECHNICAL FIELD

The present invention relates to a multidirectional input member in which multidirectional input is possible, and to an electrical device that has the multidirectional input member.

RELATED ART

A variable resistance device is well known. The conventional variable resistance device varies resistance by a contact area between a resistant rubber member and a plurality of electrodes. The resistant rubber member contacts between a plurality of the electrodes provided on a printed circuit board (PCB). International publication WO 00/072333 discloses an example of the variable resistance device. The resistant rubber member is formed by, for example, dispersing conducting particles, such as carbon black, into elastomer. Note that a region in which the resistant rubber member contacts between a plurality of the electrodes is referred to as "footprint." A joystick is provided over the resistant rubber member. When the joystick is freely moved on a plurality of the electrodes located on the PCB, a size of the "footprint" that contacts a plurality of the electrodes is changed according to pressure from the joystick and a position of the resistant rubber member. As a result, the electrical resistance between a plurality of the electrodes is changed.

The variable resistance device that has the resistant rubber member and the PCB can specify an operation position and pressure of the joystick (for example, whether the input operation is performed or not other than the pressure itself) with high accuracy.

The variable resistance device is better suited for specifying an operation direction or a linear operation position within a certain small region. In various electrical devices that can use a pointing device, such as a video game instrument, a personal digital assistant (PDA), a remote controller, or an audio equipment, it is desired that a device can point in any direction in a plane by further improving the above mentioned variable resistance device.

An object of the present invention is to provide a multidirectional input member that can point in any direction in a rectangular operation plane and an electrical device that has the multidirectional input member.

SUMMARY

In order to meet the desire discussed above, a multidirectional input member according to an embodiment of the present invention includes: a base plate; a looped sensor that includes a plurality of groups of non-contacting electrodes configured in a loop and that is formed on the base plate; and an operation plate locating opposite to the base plate. Wherein, the operation plate has a first loop-shaped protrusion that is located at a plane opposite to the base plate, that is protruded toward the base plate side, that is opposite to the looped sensor, and that is configured with a resistant rubber member, and the first protrusion has a configuration in which its sectional area of a plane parallel to the base plate is tapered in the direction from the operation plate side toward the base plate side.

In another embodiment according to the present invention, the multidirectional input member further includes: a key mat that has a larger area than the operation plate is fixed in a plane of the operation plate; the plane being in a side opposite to the base plate; and a spacer existing between the outer circumference region of the operation plate in the key mat and the base plate.

In another embodiment according to the present invention, the multidirectional input member has the following features: the base plate has at least one group of non-contacting electrodes at an inside region of the looped sensor, and the operation plate has a conducting second protrusion at a location that contacts the at least one group of the electrodes in a plane opposite to the base plate.

In another embodiment according to the present invention, the multidirectional input member has the following features: a third protrusion provided between the first protrusion and the second protrusion within a plane of the operation plate opposite to the base plate; and the third protrusion is protruded more toward the base plate side than at least the second protrusion.

In another embodiment according to the present invention, the multidirectional input member has the following features: the third protrusion is a looped protrusion surrounding the second protrusion.

In another embodiment according to the present invention, the multidirectional input member has the following features: the looped sensor is in a quadrangular frame shape, has a first electrode, second electrode, third electrode, and fourth electrode that are respectively divided in four directions and has an opposite non-contacting electrode that is located opposite to the first electrode, the second electrode, the third electrode, and the fourth electrode.

In another embodiment according to the present invention, the multidirectional input member has the following features: the opposite electrode performs as one common electrode for the first electrode, the second electrode, the third electrode, and the fourth electrode.

In another embodiment according to the present invention, the multidirectional input member has the following features: the looped sensor is in a quadrangular frame shape, and a diagonal line of at least one quadrangular corner part is a border between the two adjacent groups of the electrodes.

In another embodiment according to the present invention, the multidirectional input member has the following features: at least one of the groups of the electrodes has an alternated tooth configuration in which several multi-tooth electrodes are located in parallel to each other and alternate without contacting each other.

An electrical device according to an embodiment of the present invention includes: a multidirectional input member that has a base plate, a looped sensor in which a plurality of groups of non-contacting electrodes configured in a loop and that is formed on the base plate, and an operation plate locating opposite to the base plate, wherein, the operation plate has a first loop-shaped protrusion that is located at a plane opposite to the base plate, that is protruded toward the base plate side, that is opposite to the looped sensor, and that is configured with a resistant rubber member, and the first protrusion has a configuration in which its sectional area of a plane parallel to the base plate is tapered in the direction from the operation plate side toward the base plate side; and a control unit that is configured to specify a pressing location of the first protrusion based on electrical resistance of each of the groups of the electrodes that is changed by contact between the first protrusion and the plurality of groups of electrodes and a voltage value or current value that varies by the electrical resistance.

In another embodiment according to the present invention, the electrical device has the following features: the control unit comprises a vector generation unit that generates a vector corresponding to the voltage value or the current value of each of the groups of the electrodes, and a vector composition unit that combines several vectors when the vector generation unit generates several vectors.

In another embodiment according to the present invention, the electrical device has the following features: the base plate has at least one group of non-contacting electrodes at an inside region of the looped sensor, the operation plate has a conducting second protrusion at a location that contacts the at least one group of the electrodes in a plane opposite to the base plate, and the control unit detects input of a switch by contacting between the second protrusion and the at least one group of the electrodes.

DETAILED DESCRIPTION

Hereinafter, each of embodiments of a multidirectional input member and an electrical device that has the multidirectional input member according to the present application will be explained with reference to drawings.

[First Embodiment]

1. Multidirectional Input Member

Figure 1:
FIG. 1 is a plan view of a multidirectional input member according to a first embodiment of the present invention.
Figure 2:
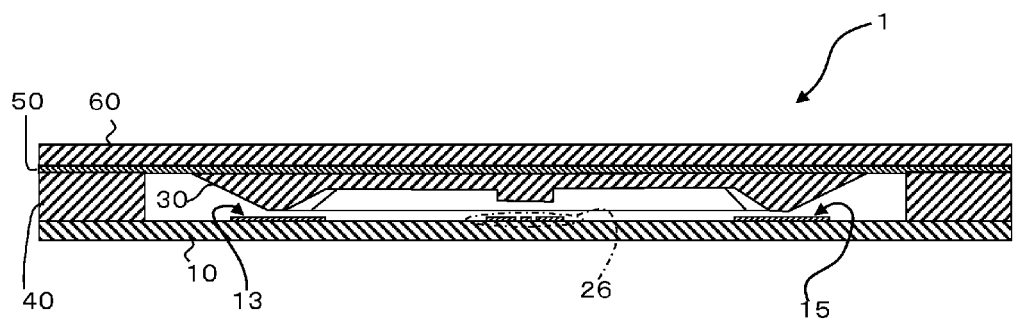
FIG. 2 is a sectional view of a multidirectional input member shown in FIG. 1 taken along line A-A.

FIG. 1 is a plan view of a multidirectional input member 1 according to a first embodiment of the present invention. FIG. 2 is a sectional view of a multidirectional input member 1 shown in FIG. 1 taken along line A-A. A multidirectional input member 1 according to a first embodiment is in an approximate rectangular parallelepiped shape. The multidirectional input member 1 has the following structure. A spacer 40 is fixed in an outer circumferential portion of a plane of a PCB 10 that is an example of a base plate, and a key mat 60 is laminated on the spacer 40. An operation plate 30 is provided in a space between the PCB 10 and the key mat 60 and surrounded by the spacer 40. The spacer 40 and the key mat 60, and the operation plate 30 and the key mat 60 are fixed through an adhesion layer 50, respectively. In a plane of the PCB 10 opposite to the operation plate 30, a group of electrodes 26 is provided in nearly the center portion of the plane, and several groups of electrodes, such as those shown at 13 and 15, are provided outside the group of electrodes 26. The operation plate 30 is fixed to the key mat 60 with a predetermined gap between the operation plate 30 and the PCB 10 without contacting the groups of electrodes 13, 15, and 26.

It is preferred that the PCB 10 is a glass epoxy board in which epoxy resin is contained and soaked in cloth woven by glass fiber cloth. However, a glass composite board and a ceramic board made of alumina or the like can be adopted as the PCB 10. The groups of electrodes 13 and 15 and the group of electrodes 26 have almost the same thickness and are configured with a thin film or a thin plate electrode made of, for example, a highly conductive material that is either gold, platinum, silver, copper, tungsten, or an alloy of two or more of the preceding metals. A base material of the operation plate 30 is configured with an adequate elastic material, preferably with thermoplastic elastomer or thermosetting elastomer, and further preferably with silicone rubber. A conducting material is dispersed in the base material of the operation plate 30 to make the base material to a rubber member with desired resistance (resistant rubber member) by adding conductivity to the silicone rubber. Examples for the conducting material are carbon black, metal, and so on. It is further preferred to use the carbon black because it is easy to manufacture particles with a small particle size (nano-level particles) and is easy to handle. In view of increasing conductivity and maintaining elasticity of the operation plate 30, a mixed quantity of the conducting material with respect to the total weight of the base material and the conducting material is preferably 5-50% by weight (wt %), and further preferably 15-35 wt %. The operation plate 30 made of the resistant rubber member has electrical resistance as contact resistance with the PCB 10 in a range of 100-1700Ω and further preferably 170-1000Ω.

The spacer 40 is not limited by its configuration material and may be configured with any materials, such as resin, glass, ceramic, metal, and lumber. The key mat 60 is preferably configured with resin or elastomer and, especially, with polycarbonate (PC) resin, polyethylene terephthalate (PET) resin, or silicone rubber. An area of the key mat 60 is preferably larger than that of the operation plate 30. The spacer 40 is located between the PCB 10 and the outer circumferential region of the operation plate 30 in the key mat 60.

Figure 3:
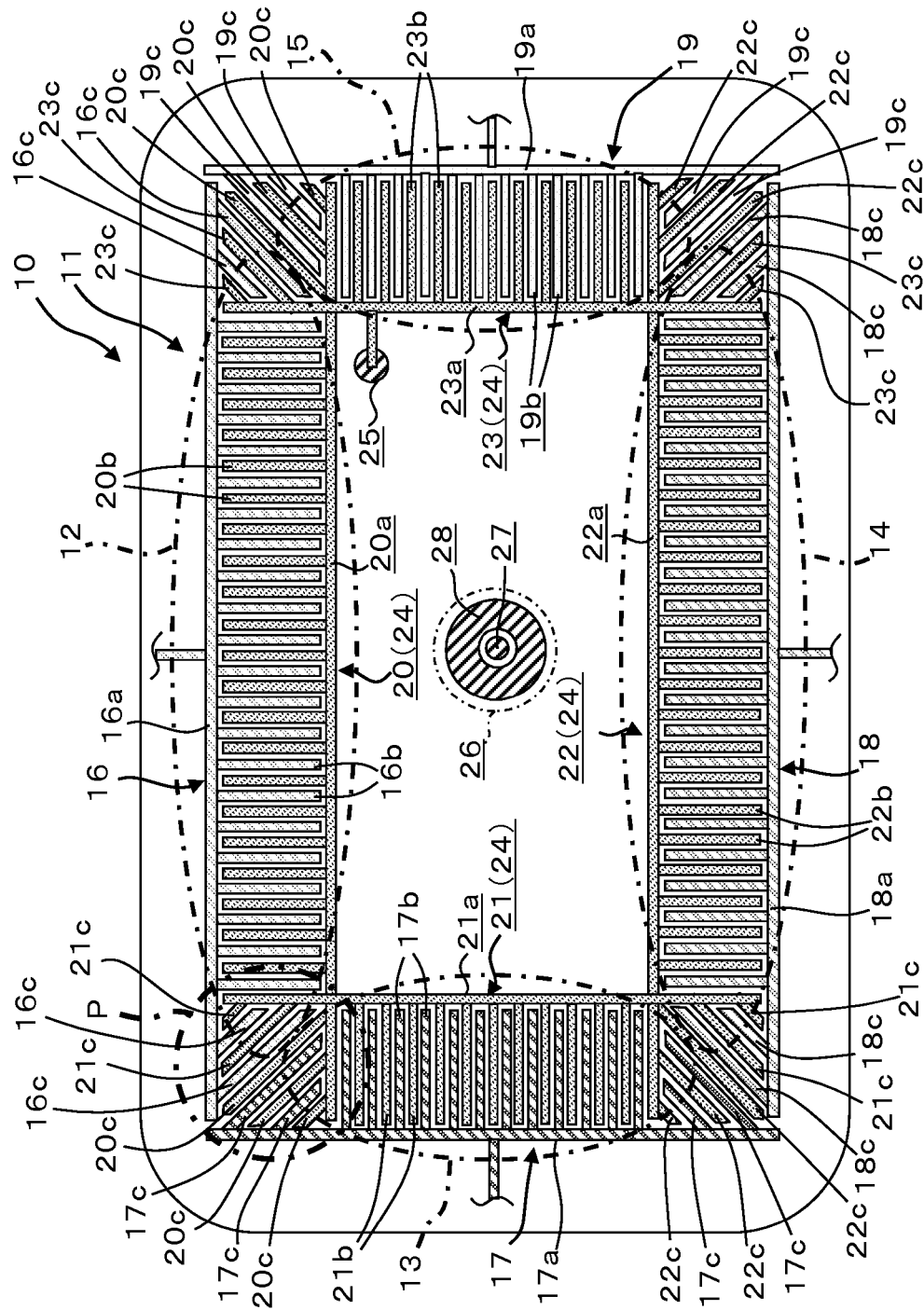
FIG. 3 is a plan view of a plane of a PCB opposite to an operation plate shown in FIG. 2.
Figure 4:
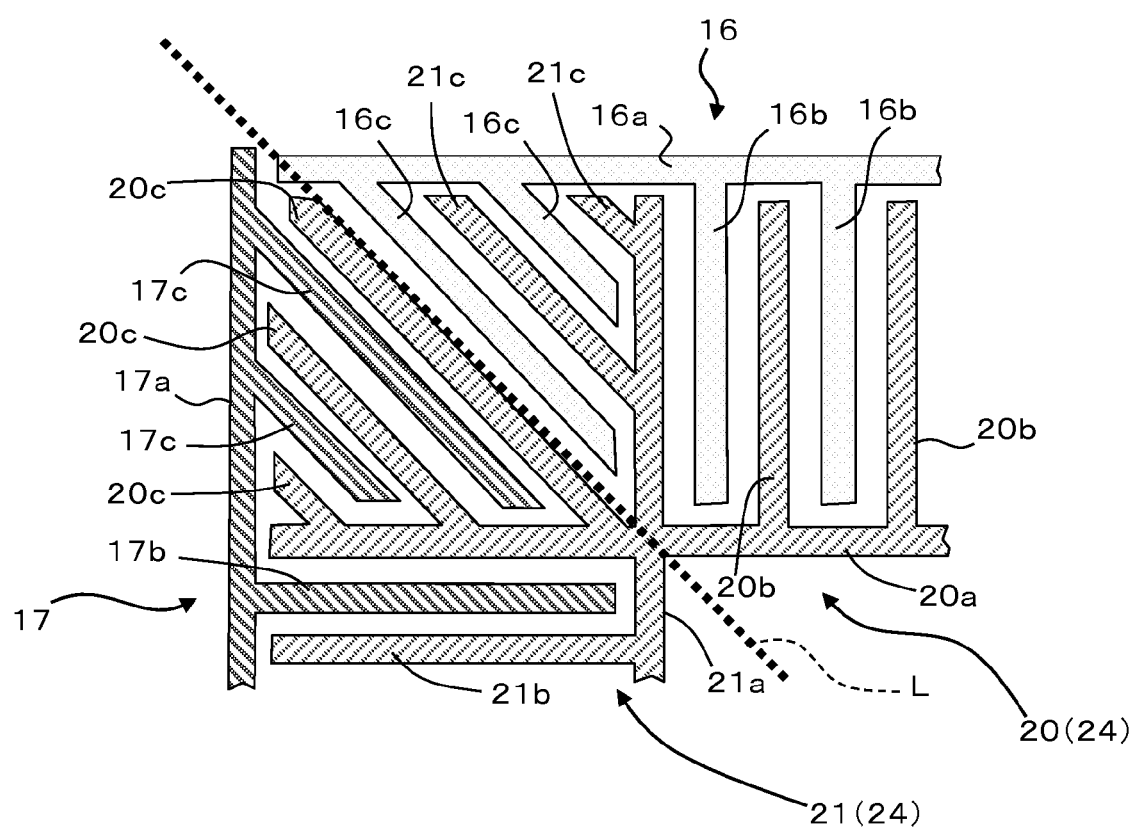
FIG. 4 is an enlarged view of a corner part P of a looped sensor shown in FIG. 3.

FIG. 3 is a plan view of a plane of a PCB 10 opposite to an operation plate 30 shown in FIG. 2. FIG. 4 is an enlarged view of a corner part P of a looped sensor 11 shown in FIG. 3. One looped sensor 11 is formed outside the group of electrodes 26 that are formed on a plane of the PCB 10 opposite to the operation plate 30 without contacting the group of electrodes 26. The group of electrodes 26 is configured with one circular electrode 27 and one annular electrode 28 located outside the circular electrode 27 without contacting the electrode 27. The looped sensor 11 can be in a quadrangular frame shape in which groups of electrodes 12-15 are located at four corners, respectively. The groups of electrodes 12 and 14 are elongated nearly parallel to the long side direction of the PCB 10. The groups of electrodes 13 and 15 are elongated nearly parallel to the short side direction of the PCB 10. The looped sensor 11 can be configured under the situation in which the following groups of electrodes are nearly orthogonal to each other: the groups of electrodes 12 and 13; the groups of electrodes 13 and 14; the groups of electrodes 14 and 15; and the groups of electrodes 15 and 12.

As shown in FIGS. 3 and 4, the group of electrodes 12 has a first electrode 16 that is located in an outer side on the PCB 10 relative to the center of the PCB 10 and an opposite electrode 20 that is located in an inner side of the PCB 10 relative to the first electrode 16. The first electrode 16 and the opposite electrode 20 are located opposite each other so as to alternate with each other without contacting except both end portions of electrodes 16 and 20. The first electrode 16 is a multi-tooth electrode having one line portion 16a and many tooth portions 16b that nearly orthogonally connect to the line portion 16a. Each of two to three teeth 16c located at both ends of the first electrode 16 is extended toward inside the PCB 10 from the line portion 16a at an acute angle. On the other hand, the opposite electrode 20 has one line portion 20a that extends nearly parallel to the line portion 16a of the first electrode 16 and many tooth portions 20b that nearly orthogonally connect to the line portion 20a. Each of two to three teeth 20c located at both ends of the opposite electrode 20 is extended toward outside the PCB 10 from the line portion 20a at an obtuse angle. The group of electrodes 13 has a second electrode 17 that is located in an outer side on the PCB 10 relative to the center of the PCB 10 and an opposite electrode 21 that is located in an inner side of the PCB 10 relative to the second electrode 17. The second electrode 17 and the opposite electrode 21 are located opposite each other so as to alternate with each other without contacting except both end portions of electrodes 17 and 21. The second electrode 17 is a multi-tooth electrode having one line portion 17a and many tooth portions 17b that nearly orthogonally connect to the line portion 17a. Each of two to three teeth 17c located at both ends of the second electrode 17 is extended toward inside the PCB 10 from the line portion 17a at an acute angle. In a corner part P in which the group of electrodes 12 is adjacent to the group of electrodes 13, two teeth 17c alternate with three teeth 20c of the opposite electrode 20 without contacting. On the other hand, the opposite electrode 21 is a multi-tooth electrode having one line portion 21a that extends nearly parallel to the line portion 17a of the second electrode 17 and many tooth portions 21b that nearly orthogonally connect to the line portion 21a. Each of two teeth 21c located at both ends of the opposite electrode 21 is extended toward outside the PCB 10 from the line portion 21a at an obtuse angle. In a corner part P in which the group of electrodes 12 is adjacent to the group of electrodes 13, two teeth 21c alternate with two teeth 16c of the first electrode 16 without contacting.

Similarly, the group of electrodes 14 has a third electrode 18 that is located in an outer side on the PCB 10 relative to the center of the PCB 10 and an opposite electrode 22 that is located in an inner side of the PCB 10 relative to the third electrode 18. The third electrode 18 and the opposite electrode 22 are located opposite each other so as to alternate with each other without contacting except both end portions of the electrodes 18 and 22. The third electrode 18 is a multi-tooth electrode having one line portion 18a and many tooth portions 18b that nearly orthogonally connect to the line portion 18a. Each of two to three teeth 18c located at both ends of the third electrode 18 is extended toward an inside of the PCB 10 from the line portion 18a at an acute angle. In a corner part in which the group of electrodes 13 is adjacent to the group of electrodes 14, two teeth 18c alternate with two teeth 21c of the opposite electrode 21 without contacting. On the other hand, the opposite electrode 22 is a multi-tooth electrode having one line portion 22a that extends nearly parallel to the line portion 18a of the third electrode 18 and many tooth portions 22b that nearly orthogonally connect to the line portion 22a. Each of two to three teeth 22c located at both ends of the opposite electrode 22 is extended toward outside the PCB 10 from the line portion 22a at an obtuse angle. In a corner part in which the group of electrodes 13 is adjacent to the group of electrodes 14, three teeth 22c alternate with two teeth 17c of the first electrode 17 without contacting.

The group of electrodes 15 has a fourth electrode 19 that is located in an outer side on the PCB 10 relative to the center of the PCB 10 and an opposite electrode 23 that is located in an inner side of the PCB 10 relative to the fourth electrode 19. The fourth electrode 19 and the opposite electrode 23 are located opposite each other so as to alternate with each other without contacting except both end portions of the electrodes 19 and 23. The fourth electrode 19 is a multi-tooth electrode having one line portion 19a and many tooth portions 19b that nearly orthogonally connect to the line portion 16a. Each of two teeth 19c located at both ends of the fourth electrode 19 is extended toward the inside of the PCB 10 from the line portion 19a at an acute angle. In a corner part in which the group of electrodes 14 is adjacent to the group of electrodes 15, two teeth 19c alternate with three teeth 22c of the opposite electrode 22 without contacting. And, in a corner part in which the group of electrodes 12 is adjacent to the group of electrodes 15, two teeth 19c alternate with three teeth 20c of the opposite electrode 20 without contacting. On the other hand, the opposite electrode 23 is a multi-tooth electrode having one line portion 23a that extends nearly parallel to the line portion 19a of the second electrode 19 and many tooth portions 23b that nearly orthogonally connect to the line portion 23a. Each of two teeth 23c located at both ends of the opposite electrode 23 is extended toward outside the PCB 10 from the line portion 23a at an obtuse angle. In a corner part in which the group of electrodes 14 is adjacent to the group of electrodes 15, two teeth 23c alternate with two teeth 18c of the third electrode 18 without contacting. And, in a corner part in which the group of electrodes 12 is adjacent to the group of electrodes 15, two teeth 23c alternate with two teeth 16c of the first electrode 16 without contacting. The opposite electrodes 20, 21, 22, and 23 are electrically connected to each other and configure one looped opposite electrode 24 with many tooth 20b, 20c, 21b, 21c, 22b, 22c, 23b, and 23c. The looped opposite electrode 24 is electrically connected to a conducting member 25 that is provided at an inner surface of a hole passing through the PCB 10 and in the vicinity of an aperture surface of the hole and can be electrically connected to the rear surface of the PCB 10.

As shown in FIG. 4, the first electrode 16 is adjacent to the second electrode 17 by a diagonal line L in the corner part P in a quadrangular shape. Therefore, a border between the groups of electrodes 12 and 13 is the diagonal line L. Similarly, in each pair of the groups of electrodes, such as 13 and 14, 14 and 15, and 15 and 12, one of two groups of electrodes is adjacent to another by a border line in a corner part in which the two groups of electrodes are adjacent in a quadrangular shape.

Figure 5:
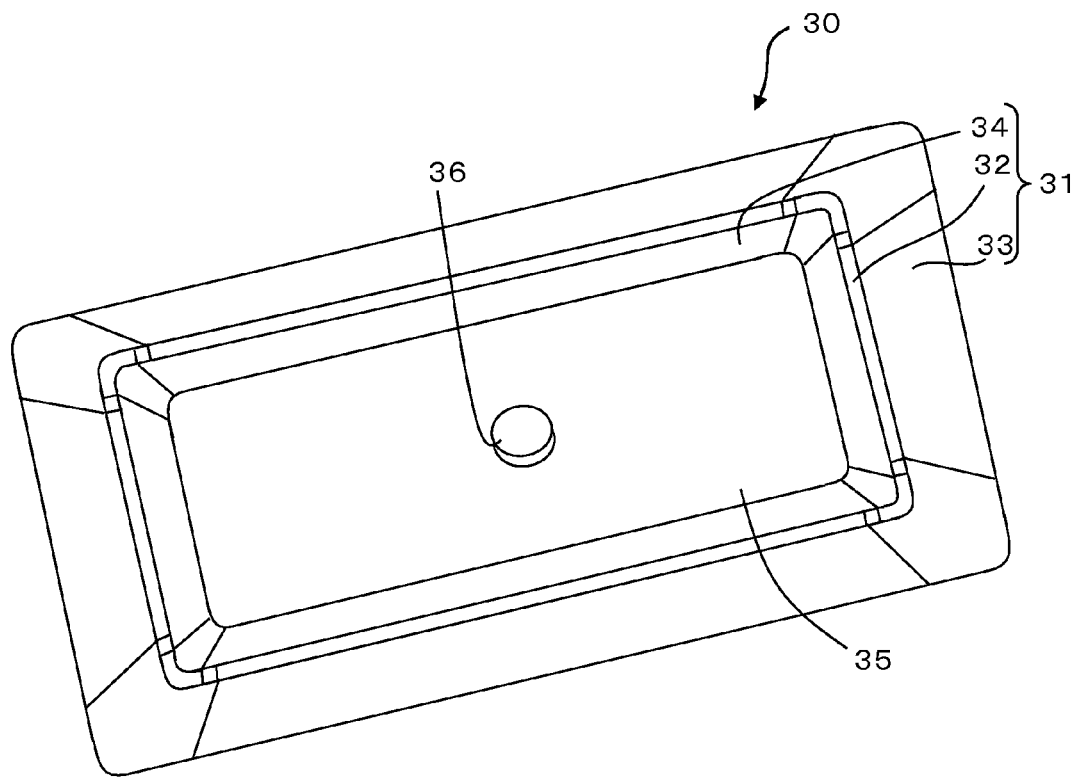
FIG. 5 is a perspective view of a state in which a plane of an operation plate opposite to a PCB shown in FIG. 2 is as an upper side.
Figure 6:
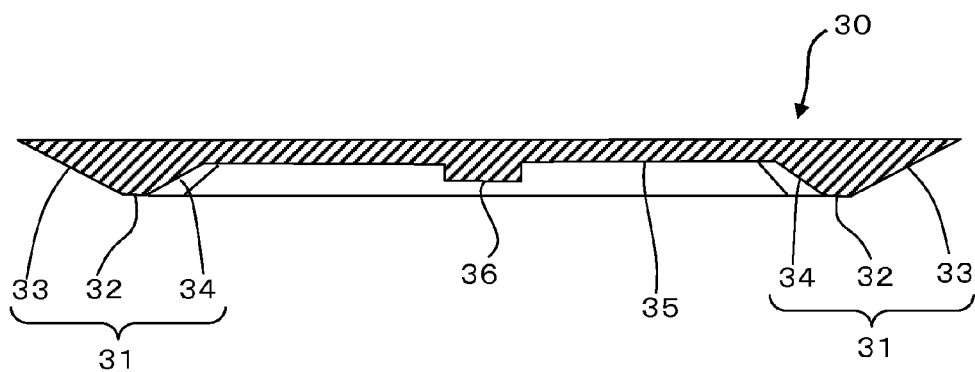
FIG. 6 is a sectional view of an operation plate shown in FIG. 2 taken along line A-A shown in FIG. 1.

FIG. 5 is a perspective view of a state in which a plane of an operation plate 30 opposite to a PCB 10 shown in FIG. 2 is as an upper side. FIG. 6 is a sectional view of an operation plate 30 shown in FIG. 2 taken along line A-A shown in FIG. 1. The operation plate 30 has one looped first protrusion 31 in an outer circumference of a plane opposite to the PCB 10. The first protrusion 31 has a level plane 32 that is protruded to a location close to the looped sensor 11. The first protrusion 31 further has an inclined plane 33 that is inclined from the level plane 32 toward the outside upper plane of the operation plate 30 and an inclined plane 34 that is inclined from the level plane 32 toward the inside upper plane of the operation plate 30. A level plane 35 that is continuously connected to the inclined plane 34 is provided further inside the inclined plane 34. A second protrusion 36 in a circular cylindrical shape is formed in the approximate center of the level plane 35 and protrudes toward the PCB 10 side. A diameter of the tip of the second protrusion 36 is larger than that of the electrode 27. The level plane 32 is formed in the location in which the level plane 32 can contact a region for the looped sensor 11 on the PCB 10. When the operation plate 30 is pressed toward the PCB 10 side, an area contacting between the first protrusion 31 and the looped sensor 11 becomes larger according to the amount of pressure. The place in which the first protrusion 31 contacts the looped sensor 11 is also varied by a pressing point of the operation plate 30. A pressing location of the operation plate 30 can be specified by using the above described functions. For example, when a pressing location of the outer circumference portion of the operation plate 30 is just above the approximate center of the group of electrodes 12 on the PCB 10 in the length direction, the first protrusion 31 mainly contacts the group of electrodes 12 and conducts electricity to the first electrode 16 and the looped opposite electrode 24 with a certain electrical resistance value. As a result, a pressing direction can be detected. In this case, the pressing direction is toward the approximate center of the group of electrodes 12 in the length direction from the center of the PCB 10. When the pressing location of the outer circumference portion of the operation plate 30 is just above an adjacent portion between the groups of electrodes 12 and 13 on the PCB 10 (just above the corner part P shown in FIG. 3), the first protrusion 31 equally contacts both regions of the groups of electrodes 12 and 13. As a result, a connection state between the first electrode 16 and the looped opposite electrode 24, and a connection state between the second electrode 17 and the looped opposite electrode 24 are both in the conducting condition with approximately the same resistance values. Therefore, the pressing direction can be detected. In this case, the pressing direction is toward the corner part P from the center of the PCB 10. When the operation plate 30 is pressed toward the PCB 10 side from above the second protrusion 36, the second protrusion 36 contacts both the electrodes 27 and 28. As a result, the electrodes 27 and 28 are electrically connected to each other. In the present embodiment, the first protrusion 31 is protruded more toward the PCB 10 side compared with the second protrusion 36. However, the present embodiment is not limited to this. The protrusion height of the first protrusion 31 may be the same as that of the second protrusion 36 or may be shorter than that of the second protrusion 36.

2. Electrical Device

Figure 7:
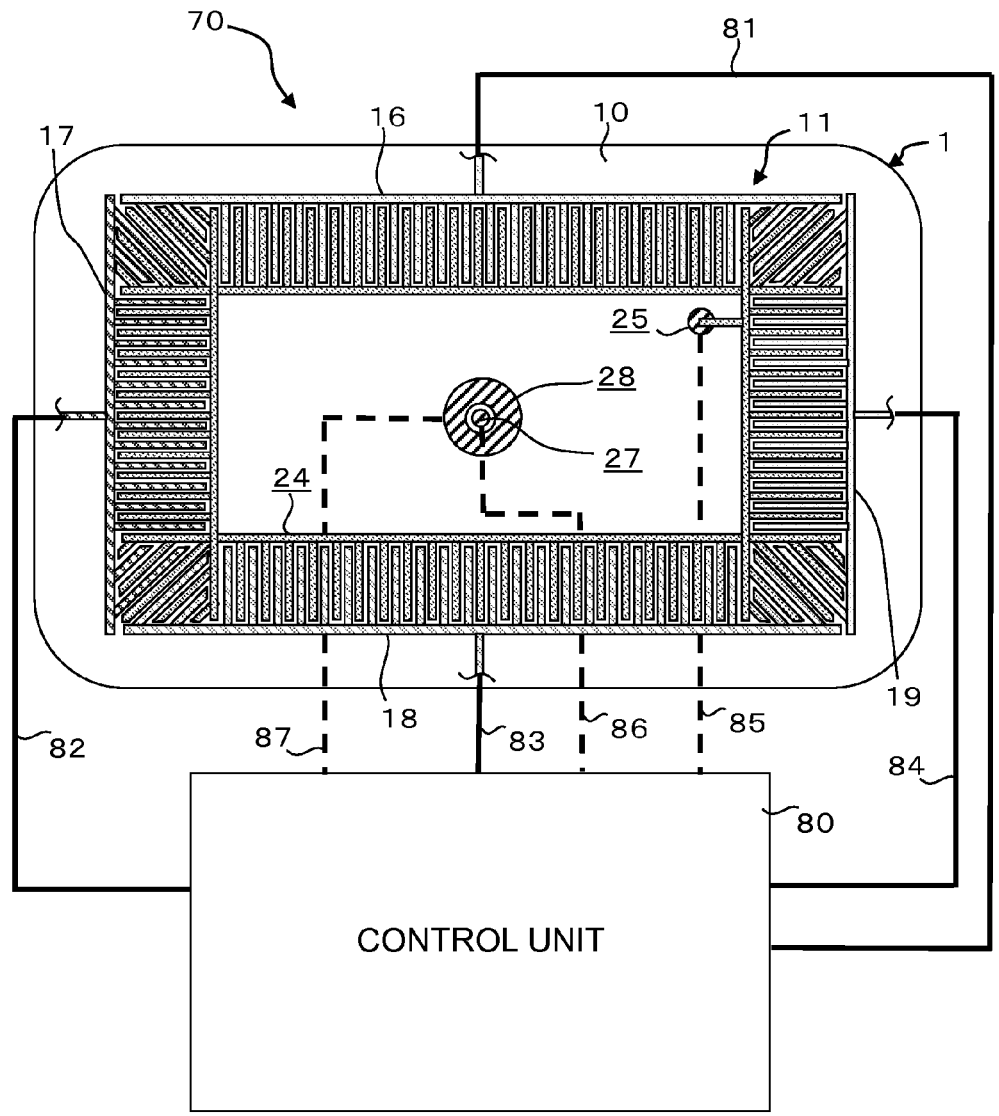
FIG. 7 is a schematic view of an electrical device that has a multidirectional input member shown in FIG. 1 according to a first embodiment.

FIG. 7 is a schematic view of an electrical device that has a multidirectional input member 1 shown in FIG. 1 according to a first embodiment. An electrical device 70 according to a first embodiment has the above mentioned multidirectional input member 1 and a control unit 80. The control unit 80 specifies an operation direction and existence or nonexistence of an input of a switch through an accepting operation by the operation plate 30. The first electrode 16, the second electrode 17, the third electrode 18, the fourth electrode 19, and the looped opposite electrode 24 on the PCB 10 are electrically connected to the control unit 80 through line 81, line 82, line 83, line 84, and line 85, respectively. And the electrodes 27 and 28 are electrically connected to the control unit 80 through line 86 and line 87, respectively. When the first protrusion 31 contacts the looped sensor 11, each group of electrodes 12, 13, 14 and 15 is sequentially switched to activate different electrodes for measurement of sensor data. For example, when the group of electrodes 12 is activated, other groups of electrodes 13, 14 and 15 are deactivated; and then when the group of electrodes 13 is activated, other groups of electrodes 12, 14 and 15 are deactivated.

Figure 8:
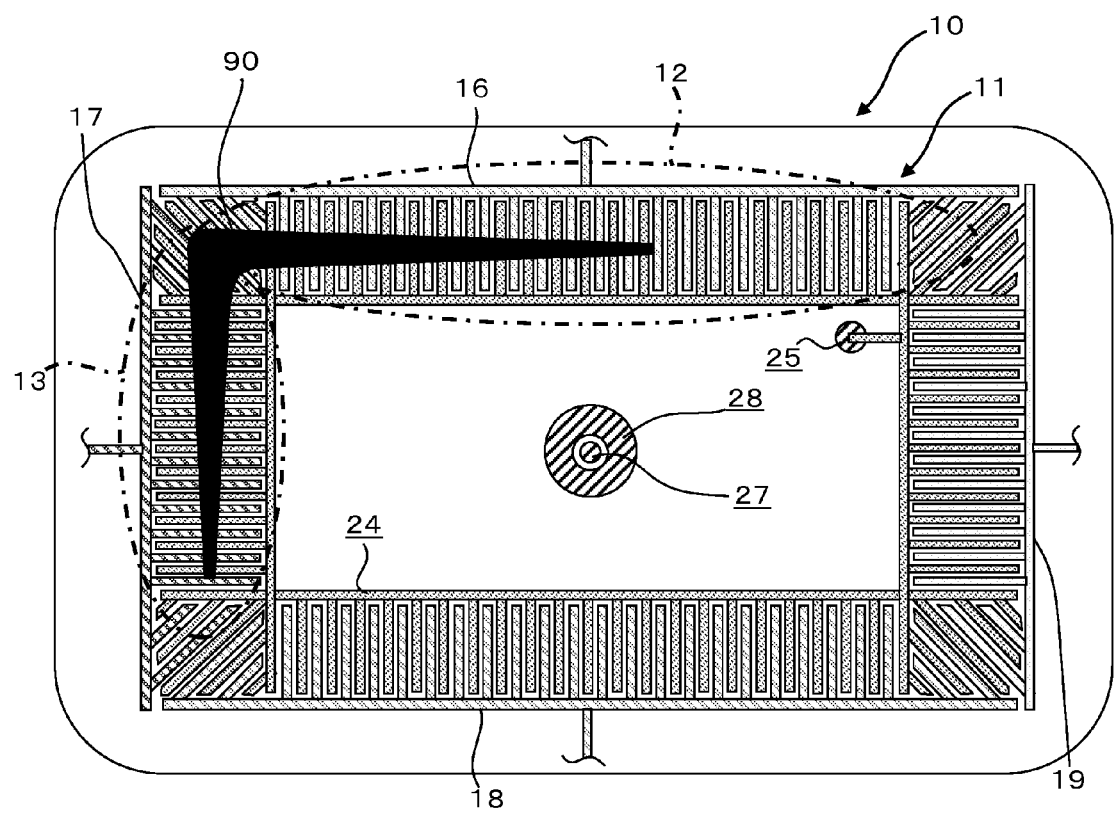
FIG. 8 is a schematic view of a contact region between an operation plate and a looped sensor when a specific location on a PCB shown in FIG. 7 is pressed.

FIG. 8 is a schematic view of a contact region between an operation plate 30 and a looped sensor 11 when a specific location on a PCB 10 shown in FIG. 7 is pressed. When the vicinity of a corner part in which the groups of electrodes 12 and 13 are adjacent each other is pressed toward the PCB 10 from the operation plate 30, a place that is close to the corner part of the first protrusion 31 mainly contacts the looped sensor 11. Consequently, as shown in FIG. 8, the first protrusion 31 contacts an adjacent region between the groups of electrodes 12 and 13 with a larger area than other areas. The contact area between the first protrusion 31 and the looped sensor 11 is gradually smaller toward each center portion of the groups of electrodes 12 and 13 from the contact region. A V-shaped black portion 90 shows an example of the contact area.

Figure 9:
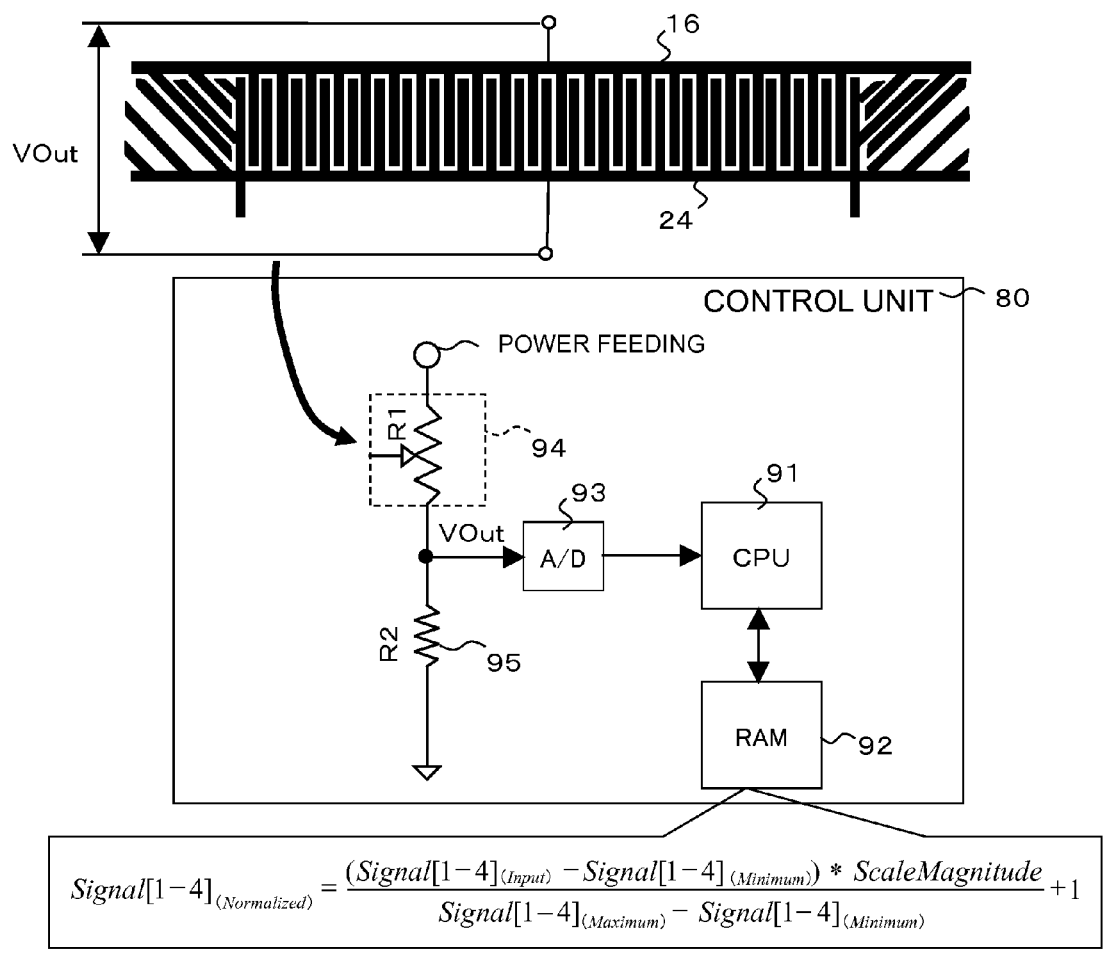
FIG. 9 is a schematic view for explaining a method for specifying an operation direction based on voltage from a looped sensor in a control unit shown in FIG. 7.

FIG. 9 is a schematic view for explaining a method for specifying an operation direction based on voltage from a looped sensor in a control unit 80 shown in FIG. 7. The control unit 80 is configured with a central processing unit (CPU) 91, a random access memory (RAM) 92, and an analog-digital converter (A/D converter) 93. The control unit 80 may be assembled on the PCB 10 or anywhere other than the PCB 10. The CPU 91 can specify a pressing location of the first protrusion 31 based on electrical resistance values of each of the groups of electrodes 12-15 in which its electrical resistance values are changed by contact between the first protrusion 31 and the electrodes 12-15 or based on voltage values that are changed by the electrical resistance values (in the present embodiment, hereinafter referred to as "voltage value" representing both electrical resistance values and voltage values). The CPU 91 may implement the sequential switching of each group of electrodes 12-15 mentioned above. Specifically, the CPU 91 has also the following units: a vector generation unit generates a vector corresponding to a voltage value of each of the groups of electrodes 12-15; and a vector composition unit that combines several vectors when the vector generation unit generates several vectors. The CPU 91 also detects an input of a switch according to the contact between the second protrusion 36 and the group of electrodes 26. The CPU 91 further has the following units: a signal conversion unit in which a voltage value for each of the groups of electrodes 12-15 is converted to a signal by using a calculating expression stored in the RAM 92; and a normalization processing unit that normalizes the converted signal by using another calculating expression stored in the RAM 92. The normalization processing reduces the influence of variation among the signals. It is preferred that the CPU 91 as the normalization processing unit can normalize the signals by using a ratio of a detection signal with respect to a detected width of a signal within a certain period of time for each of the groups of electrodes 12-15. The normalization processing is not indispensable processing and is arbitrary processing in a preferred embodiment. However, the normalization processing is preferred processing to always detect an accurate operation direction when variation of electrical resistance attributed to partial time degradation of the first protrusion 31 is considered.

The RAM 92 stores an expression (signal conversion expression) for which voltage obtained by contacting between the first protrusion 31 and each of the groups of electrodes 12-15 is converted to a signal and an expression (normalization expression) for which the signal is normalized. A preferred example for the signal conversion expression is as follows: y=−ax+b [y: signal (y>0), x: voltage (x>0), and a and b: positive numbers] or y=a/x [y: signal (y>0), x: voltage (x>0), and a: positive number]. As described in the above example, it is preferred for the expression that when a voltage is reduced by increasing an area in which the first protrusion 31 contacts each of the groups of electrodes 12-15, a signal is increased. It is preferred that the signal conversion expression is contained in a computer program used for signal conversion. The normalization expression is the same as the signal conversion expression discussed above. Each of the groups of electrodes 12-15 has a function as a sort of variable resistance as discussed above. Each electrical resistance value between the opposite electrode 24 and each of the first electrode 16, the second electrode 17, the third electrode 18, and the fourth electrode 19 that configure each of the groups of electrodes 12-15 is varied according to the contact area of the first protrusion 31. As shown in FIG. 9, the PCB 10 has a circuit that connects a resistor R1 to a resistor R2 in series. The resistor R1 is a variable resistance 94 and, in fact, corresponds to each of the groups of electrodes 12-15. The resistor R2 is a resistance 95 that has a fixed resistance value. As an exemplary explanation with citing the group of electrodes 12, a voltage (VOut) between the opposite electrode 24 and the first electrode 16 that configures the group of electrodes 12 is converted to a digital value by an A/D converter 93. After the CPU 91 instructs to read a computer program stored in the RAM 92, the CPU 91 instructs to convert the digital value to a signal through the signal conversion unit by using the signal conversion expression explained above and then instructs to normalize the signal through the normalization processing unit by using the normalization expression described below in the computer program. With respect to other groups of electrodes 13-15 other than the group of electrodes 12, the CPU 91 instructs to convert a voltage to a signal and then normalize the signal in the same manner discussed above.

$$\text{Signal}[1-4]_{(Normalized)} = \frac{(\text{Signal}[1-4]_{(Input)} - \text{Signal}[1-4]_{(Minimum)}) * ScaleMagnitude}{\text{Signal}[1-4]_{(Maximum)} - \text{Signal}[1-4]_{(Minimum)}} + 1$$

In the above expression, "Signal[1-4]$_{(normalized)}$" means a signal of the groups of electrodes 12-15 after normalization processing. "Signal[1-4]$_{(Maximum)}$" and "Signal[1-4]$_{(Minimum)}$" mean a maximum value and minimum value of signals stored in the RAM 92, respectively. The maximum value and the minimum value mean each value of maximum and minimum, respectively, among many signals generated based on electrical resistance that is varied during the deforming process caused by pressing of the first protrusion 31. It is preferred that if new maximum and minimum values are more qualified than currently saved values, signals of the saved values are overwritten with signals of the new values. When all assigned memory capacity in the RAM 92 is used, signals stored in the RAM 92 may be deleted in the order from the oldest to the newest. Further alternatively, after a certain period of time has passed (for example, 72 hours), signals stored in the RAM 92 may be deleted in the order from the oldest to the newest. "Signal[1-4]$_{(Input)}$" means a signal that is obtained by converting a voltage detected through the contact of the first protrusion 31. "Scale Magnitude" means a coefficient (for example, "32" in the present embodiment, but any numbers can be used). For example, in the group of electrodes 12, the maximum value, "Signal[1]$_{(Maximum)}$," and the minimum value, "Signal[1]$_{(Minimum)}$," for signals in the RAM 92 are 100 and 5, respectively. The signal, "Signal[1]$_{(Input)}$," that is obtained by converting a voltage detected is 15. The coefficient, "Scale Magnitude," is 32. Then, the signal, "Signal[1]$_{(Normalized)}$," after normalization processing is calculated by using the above expression as follows: 1+(15−5)×32/(100−5)=4.4. Similarly, with respect to other groups of electrodes 13-15, signals, "Signal[2]$_{(Normalized)}$," "Signal[3]$_{(Normalized)}$," and "Signal[4]$_{(Normalized)}$," after normalization processing can be calculated by using the above expression.

The control unit 80 can have ROM, EEPROM, and so on other than the CPU 91, the RAM 92, and the A/D converter 93. In this case, the ROM or the EEPROM may execute part or all of the functions of the RAM 92. The computer program containing the signal conversion expression and the normalization expression may be installed in the electrical device 70 through an external network or may be stored in the RAM 92 of the control unit 80 by inserting an information recording medium into a slot (not shown) of the electrical device 70.

Next, processing starting from a pressing operation from above the operation plate 30 through specifying a pressing operation direction will be explained. When a part of the first protrusion 31 contacts the looped sensor 11 by pressing the operation plate 30 from the key mat 60, the CPU 91 instructs to detect a voltage value of each of the groups of electrodes 12-15 that configure the looped sensor 11 through the A/D converter 93. And, the CPU 91 instructs to read a predetermined computer program in the RAM 92 and instructs to convert each voltage of each of the groups of electrodes 12-15 to each signal by using the signal conversion expression. Then, the CPU 91 instructs to perform normalization processing of each of the signals by using the normalization expression. Then, the CPU 91 as the vector generation unit instructs to generate a vector by using the signal after normalization processing for each of the groups of electrodes 12-15 that relates to the detection of voltage values. And, the CPU 91 as the vector composition unit instructs to combine generated vectors. Lastly, the CPU 91 instructs to decide that a direction of a combined vector is an operation direction.

Figure 10:
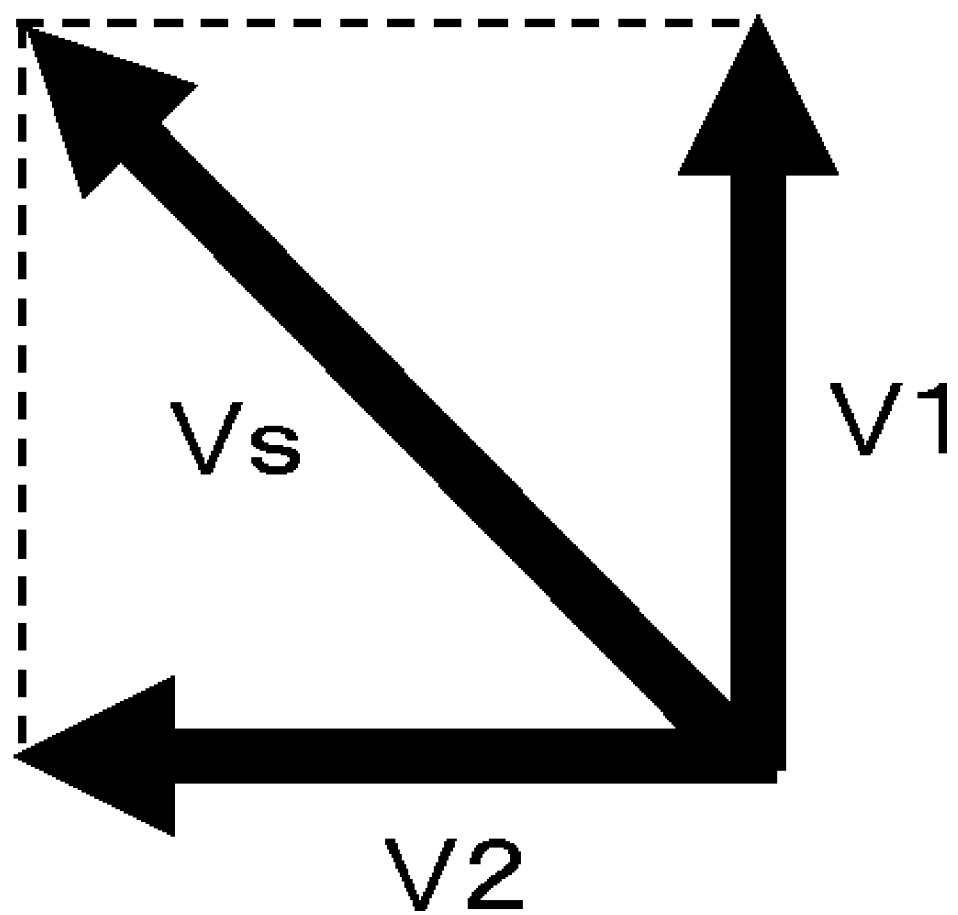
FIG. 10 is a vector graph for explaining a vector composition method when a first protrusion contacts a looped sensor at a V-shaped black portion shown in FIG. 8.

FIG. 10 is a vector graph for explaining a vector composition method when a first protrusion 31 contacts a looped sensor 11 at a V-shaped black portion 90 shown in FIG. 8. Since the first protrusion 31 contacts both the groups of electrodes 12 and 13, the CPU 91 instructs to generate vectors V1 and V2. Then, the CPU 91 instructs to combine the vectors V1 and V2 so as to make a vector Vs. As a result, the CPU 91 instructs to decide that a direction of the vector Vs is a pressing operation direction.

[Second Embodiment]

Next, a multidirectional input member according to a second embodiment of the present invention will be explained. In the second embodiment, when a structure that is in common with the first embodiment, the same reference numeral is given, and its explanation is omitted.

Figure 11:
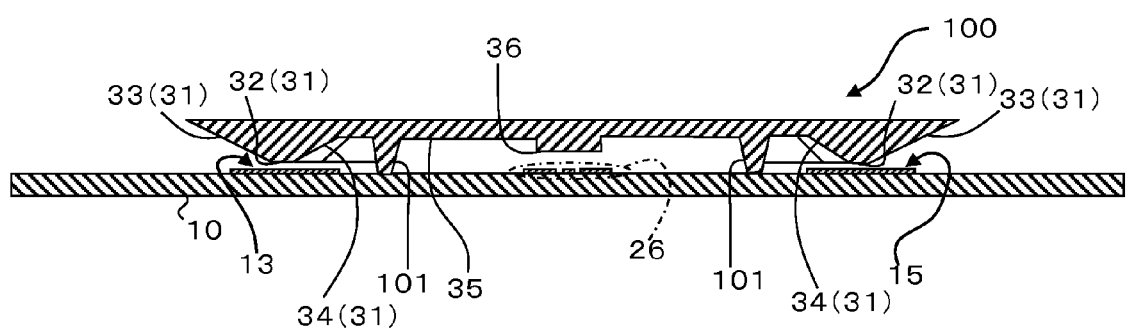
FIG. 11 is a sectional view of a multidirectional input member according to a second embodiment.
Figure 12:
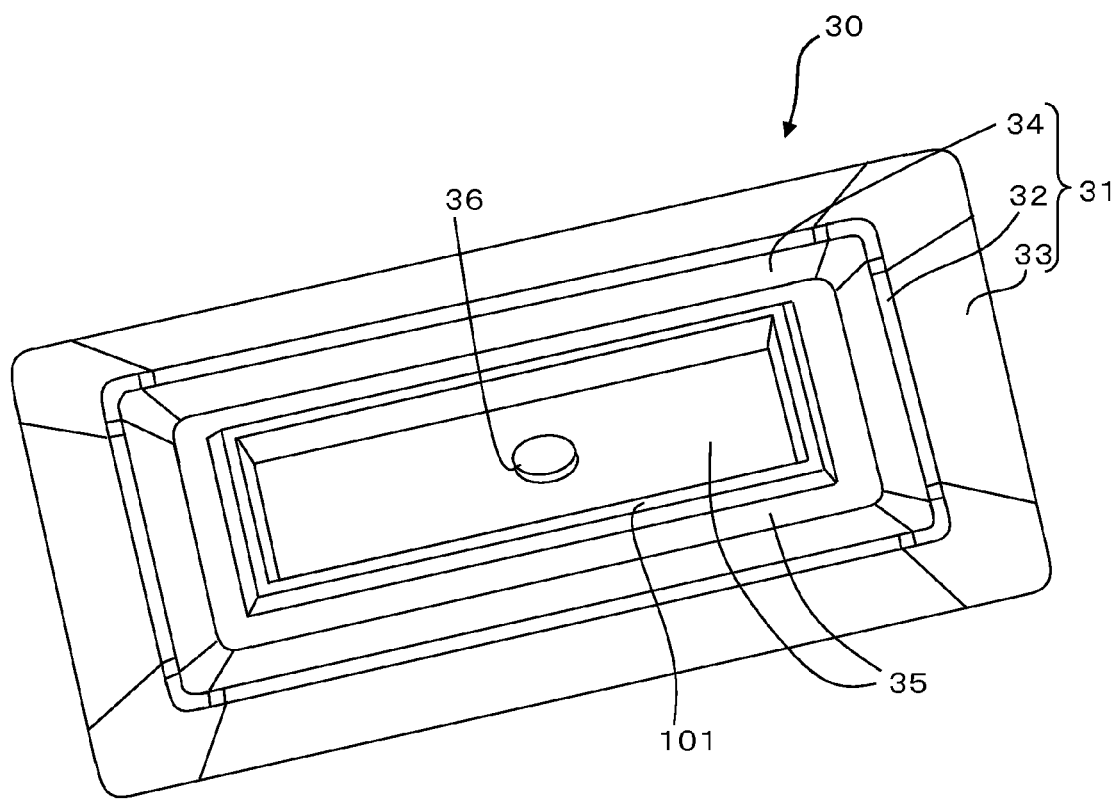
FIG. 12 is a perspective view of a state in which a plane of an operation plate, which is configured as a multidirectional input member, opposite to a PCB shown in FIG. 11 is as an upper side.

FIG. 11 is a sectional view of a multidirectional input member 100 according to the second embodiment. FIG. 12 is a perspective view of a state in which a plane of an operation plate 30, which is configured as a multidirectional input member 100, opposite to a PCB 10 shown in FIG. 11 is as an upper side. A multidirectional input member 100 according to the second embodiment has a structure including a third protrusion 101 in addition to the structures of the multidirectional input member 1 according to the first embodiment. The operation plate 30 has the third protrusion 101 between the first protrusion 31 and the second protrusion 36 within a plane of the operation plate 30 opposite to the PCB 10. The third protrusion 101 is a looped protrusion surrounding the second protrusion 36 and is protruded more toward the PCB 10 side than both the first protrusion 31 and the second protrusion 36. As a result, when the operation plate 30 is mounted on the PCB 10, only the third protrusion 101 contacts the PCB 10. But, the first protrusion 31 and the second protrusion 36 do not contact the groups of electrodes 12-15 and the group of electrodes 26, respectively. The third protrusion 101 has a function to separate the first protrusion 31 from the second protrusion 36. Therefore, when the first protrusion 31 is pressed toward the looped sensor 11, the second protrusion 36 does not contact the group of electrodes 26. Similarly, when the second protrusion 36 is pressed toward the group of electrodes 26, the first protrusion 31 does not contact the looped sensor 11.

[Other Embodiments]

The embodiments discussed above are preferred embodiments according to the present invention. The present invention can be realized with several variations so long as such variations are not to be regarded as a departure from the object of the invention.

Figure 13:
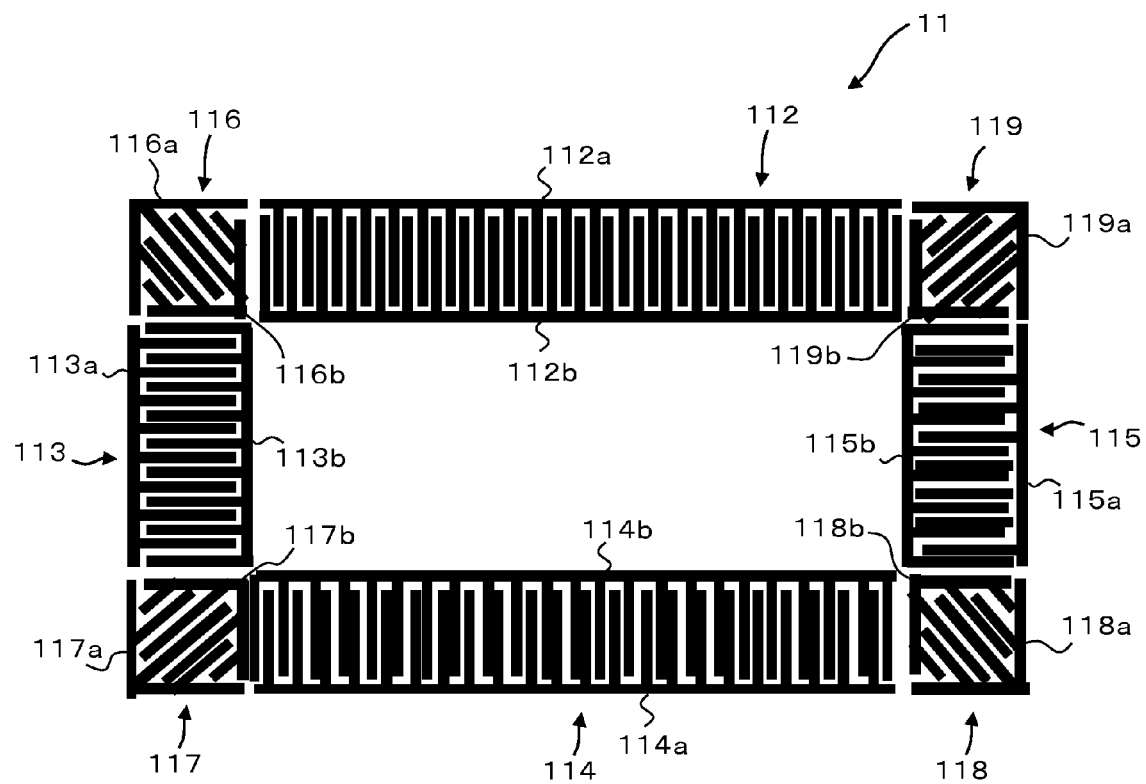
FIG. 13 is a schematic view of another variation example of a looped sensor on a PCB that configures a multidirectional input member according to a first embodiment.

FIG. 13 is a schematic view of another variation example of a looped sensor 11 on a PCB 10 that is configured as a multidirectional input member 1 according to a first embodiment. The looped sensor 11 shown in FIG. 13 has groups of electrodes 112-119. The group of electrodes 112 has a configuration in which many tooth of a multi-tooth electrode 112a alternate with many tooth of a multi-tooth electrode 112b so that the multi-tooth electrodes 112a and 112b are located opposite each other. Similarly, the group of electrodes 113 has a configuration in which many tooth of a multi-tooth electrode 113a alternate with many tooth of a multi-tooth electrode 113b so that the multi-tooth electrodes 113a and 113b are located opposite each other. The group of electrodes 114 has a configuration in which many tooth of a multi-tooth electrode 114a alternate with many tooth of a multi-tooth electrode 114b so that the multi-tooth electrodes 114a and 114b are located opposite each other. The group of electrodes 115 has a configuration in which many tooth of a multi-tooth electrode 115a alternate with many tooth of a multi-tooth electrode 115b so that the multi-tooth electrodes 115a and 115b are located opposite each other. The groups of electrodes 112 and 114 correspond to each long side of the looped sensor 11 with a quadrangular frame shape. The groups of electrodes 113 and 115 correspond to each short side of the looped sensor 11 with the quadrangular frame shape. The group of electrodes 116 is located at a corner part with a rectangular shape between the groups of electrodes 112 and 113. The group of electrodes 116 has a configuration in which many tooth of a multi-tooth electrode 116a alternate with many tooth of a multi-tooth electrode 116b in the diagonal direction of the corner part so that the multi-tooth electrodes 116a and 116b are located opposite each other. The group of electrodes 117 is located at a corner part with the rectangular shape between the groups of electrodes 113 and 114. The group of electrodes 117 has a configuration in which many tooth of a multi-tooth electrode 117a alternate with many tooth of a multi-tooth electrode 117b in the diagonal direction of the corner part so that the multi-tooth electrodes 117a and 117b are located opposite each other. The group of electrodes 118 is located at a corner part with the rectangular shape between the groups of electrodes 114 and 115. The group of electrodes 118 has a configuration in which many tooth of a multi-tooth electrode 118a alternate with many tooth of a multi-tooth electrode 118b in the diagonal direction of the corner part so that the multi-tooth electrodes 118a and 118b are located opposite each other. The group of electrodes 119 is located at a corner part with the rectangular shape between the groups of electrodes 115 and 112. The group of electrodes 119 has a configuration in which many tooth of a multi-tooth electrode 119a alternate with many tooth of a multi-tooth electrode 119b in the diagonal direction of the corner part so that the multi-tooth electrodes 119a and 119b are located opposite each other. As shown in FIG. 13, since the looped sensor 11 has eight groups of electrodes 112-119, the CPU 91 can specify operation directions with maximum eight directions according to each voltage value when the first protrusion 31 contacts the looped sensor 11.

Figure 14:
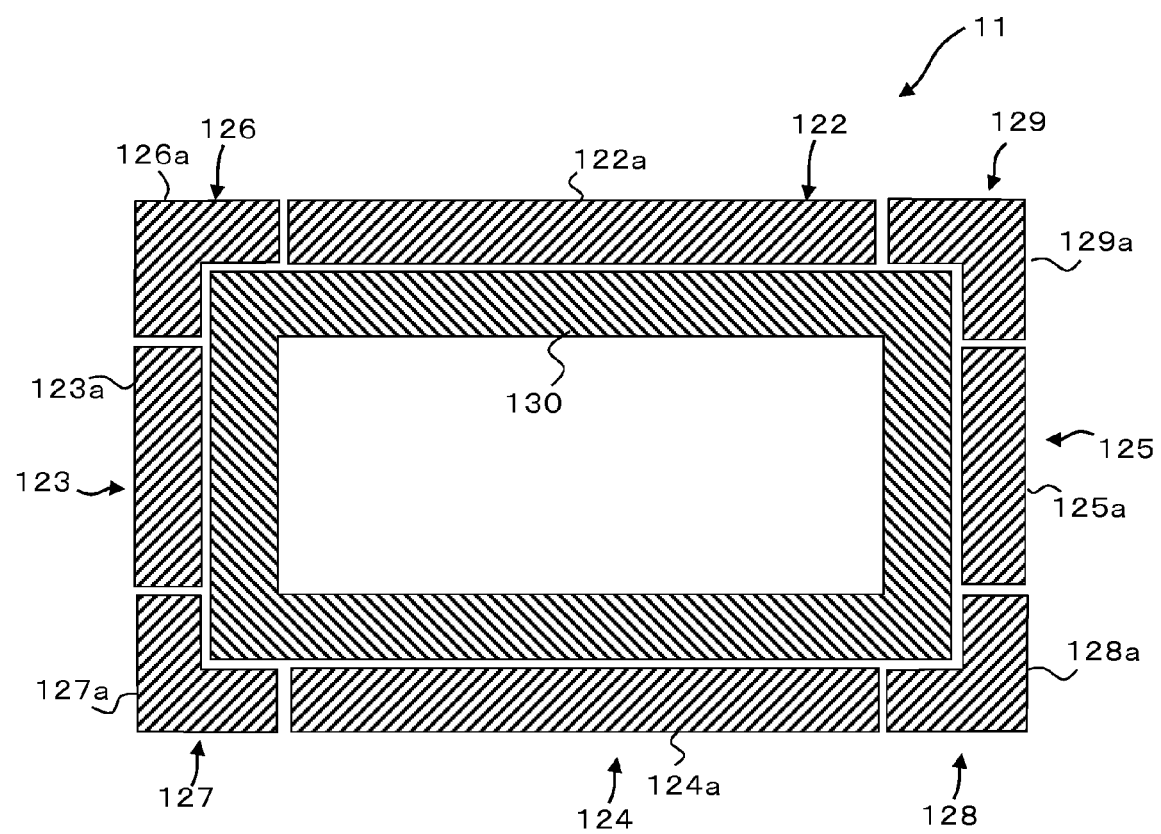
FIG. 14 is a schematic view of yet another example of a looped sensor that is different from a looped sensor shown in FIG. 13.

FIG. 14 is a schematic view of yet another example of a looped sensor 11 that is different from the looped sensor 11 shown in FIG. 13. A looped sensor 11 shown in FIG. 14 has the groups of electrodes 122-129. The looped sensor 11 has an opposite electrode 130 in a quadrangular frame shape at the location close to the center of the looped sensor 11. The group of electrodes 122 has a configuration in which an electrode 122a with a rectangular shape is adjacent to the opposite electrode 130 through a gap. The group of electrodes 123 has a configuration in which an electrode 123a with the rectangular shape is adjacent to the opposite electrode 130 through a gap. The group of electrodes 124 has a configuration in which an electrode 124a with the rectangular shape is adjacent to the opposite electrode 130 through a gap. The group of electrodes 125 has a configuration in which an electrode 125a with the rectangular shape is adjacent to the opposite electrode 130 through a gap. The groups of electrodes 122 and 124 correspond to each long side of the looped sensor 11 with a quadrangular frame shape. The groups of electrodes 123 and 125 correspond to each short side of the looped sensor 11 with the quadrangular frame shape. The group of electrodes 126 is located at a corner part with the rectangular shape between the groups of electrodes 122 and 123. The group of electrodes 126 has a configuration in which an electrode 126a with an L-shape is adjacent to the opposite electrode 130 through a gap. The group of electrodes 127 is located at a corner part with the rectangular shape between the groups of electrodes 123 and 124. The group of electrodes 127 has a configuration in which an electrode 127a with the L-shape is adjacent to the opposite electrode 130 through a gap. The group of electrodes 128 is located at a corner part with the rectangular shape between the groups of electrodes 124 and 125. The group of electrodes 128 has a configuration in which an electrode 128a with the L-shape is adjacent to the opposite electrode 130 through a gap. The group of electrodes 129 is located at a corner part with the rectangular shape between the groups of electrodes 125 and 122. The group of electrodes 129 has a configuration in which an electrode 129a with the L-shape is adjacent to the opposite electrode 130 through a gap. A path that is configured with the gap between the opposite electrode 130 and each of the electrodes 122a, 123a, 124a, 125a, 126a, 127a, 128a, and 129a is preferably located at a position opposite to the first protrusion 31 of the operation plate 30 and is the same size as a path of the level plane 32, but is narrower than the width of the level plane 32. As shown in FIG. 14, since the looped sensor 11 has eight groups of electrodes 122-129, the CPU 91 can specify operation directions with maximum eight directions according to each voltage value when the first protrusion 31 contacts the looped sensor 11.

Figure 15A:
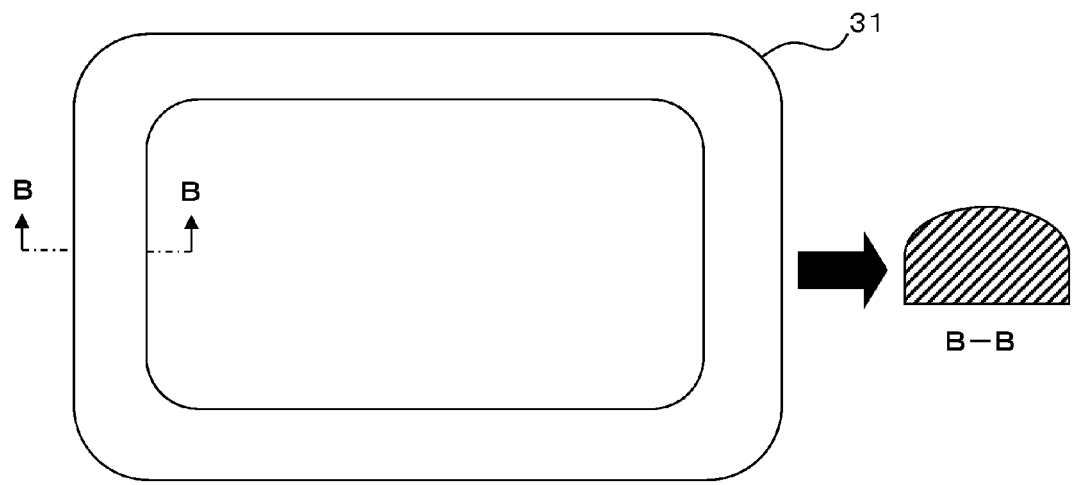
FIGS. 15A and 15B are schematic views of other examples of first protrusions that have a different sectional shape from a first protrusion of a multidirectional input member according to a first embodiment.
Figure 15B:
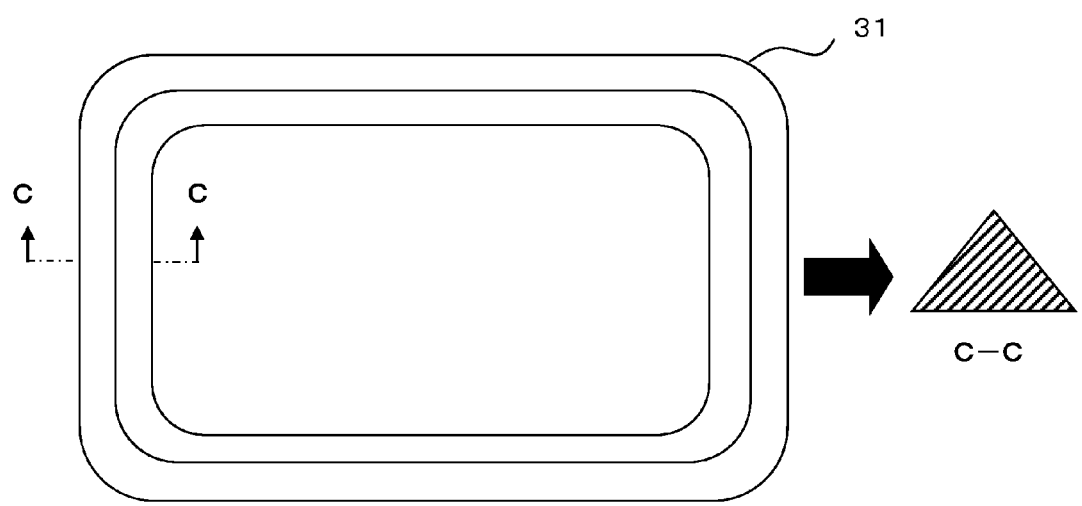
Figure 16A:
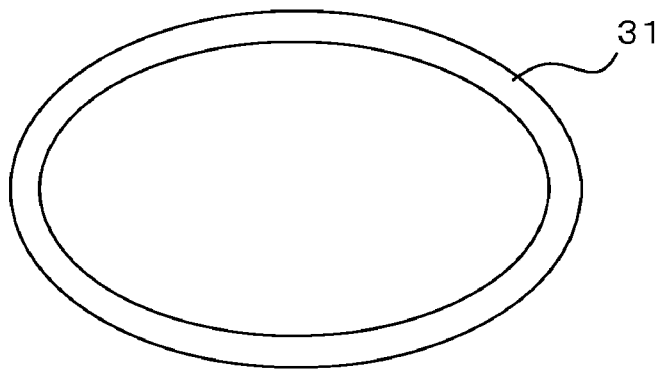
FIGS. 16A-16C are schematic views of yet other examples of operation plates with first protrusions that have a different loop shape from a first protrusion of a multidirectional input member according to a first embodiment.
Figure 16B:
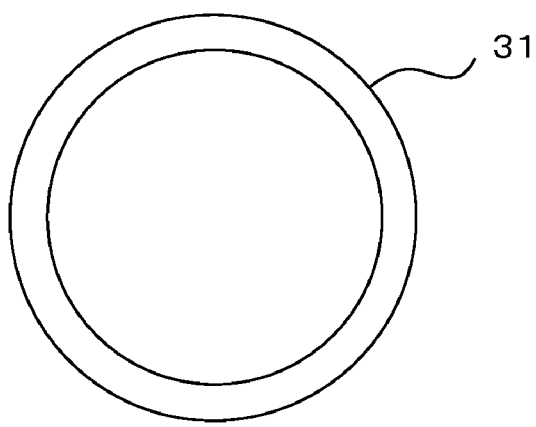
Figure 16C:
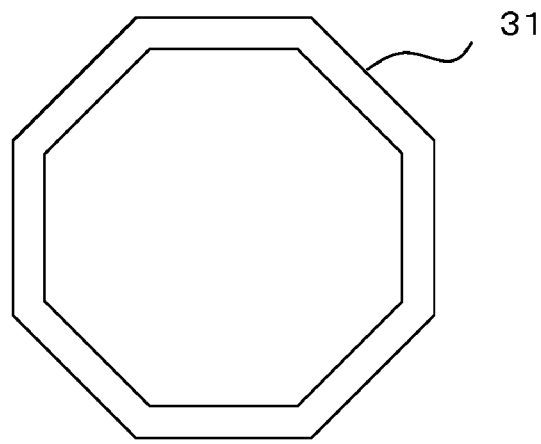

The present invention is realized with the following various configurations other than the looped sensor 11. The entire operation plate 30 need not be made of a resistant rubber member. Instead, at least, the first protrusion 31 may be made of the resistant rubber member, and others may be made of resin. The first protrusion 31 is made of a silicone rubber material mixed with carbon black so that the first protrusion 31 may be adhered to the key mat 60 made of silicone rubber. Joining methods between the first protrusion 31 and the key mat 60 may be adopted as a snap-in method or a combination of the snap-in and adhesion methods other than the adhesion method. So long as a sectional area of the first protrusion 31 is tapered in the direction from the operation plate 30 toward the PCB 10, the first protrusion 31 may be configured with another configuration other than the configuration that is formed with the level plane 32 and inclined planes 33 and 34 on both sides of the level plane 32. For example, the inclined planes 33 and 34 may have curved surfaces curving toward the PCB 10. The level plane 32 may be replaced with one with a curved surface protruding toward the PCB 10. Further, as shown in FIGS. 15A and 15B, the first protrusion 31 can be members that have different sectional shapes, such as a curved U-shape or a triangular shape. And, as shown in FIGS. 16A-16C, the first protrusion 31 is not limited to a quadrangular frame shape in planar view, but may have an elliptical shape, a circular shape, or a polygonal shape with five (pentagon) or more angles. Further, the first protrusion 31 is not limited to a continuous looped shape, but may be a plurality of islands in which a part of the path of the first protrusion 31 is divided into two or more pieces. The spacer 40 may be provided for the second embodiment. Because the key mat 60 is not an essential structure for the multidirectional input members 1 and 100, the spacer 40 may exist between the outer circumference of the operation plate 30 and the PCB 10 without the key mat 60. When the operation plate 30 is not pressed, the first protrusion 31 may contact the looped sensor 11. One or more groups of electrodes in addition to the group of electrodes 26 may be formed inside the region of the looped sensor 11 so that another protrusion in addition to the second protrusion 36 may be provided at the operation plate 30 according to the number of additional groups of electrodes. A material for the second protrusion 36 is not limited to the resistant rubber member, but may be a metal. Because the second protrusion 36 and the group of electrodes 26 are not essential structures for the multidirectional input members 1 and 100, they may not be provided for the multidirectional input members 1 and 100. It is preferred that the third protrusion 101 is protruded more toward the PCB 10 side than both the first protrusion 31 and the second protrusion 36; however, the protruded height of the third protrusion 101 can be equal to or less than that of the first protrusion 31. The third protrusion 101 is not limited to a continuous looped protrusion, but may be a plurality of islands in which a part of the path of the third protrusion 101 is divided into two or more pieces.

According to each of the embodiments discussed above, the looped sensor 11 is configured with the groups of electrodes that are located by dividing into four directions or eight directions. However, the present invention is not limited to this, and the looped sensor 11 may be configured with groups of electrodes that are located by dividing into five through seven directions or nine or more directions. The opposite electrodes 24 and 130 are a common electrode opposite to each of the electrodes that configure each of the groups of electrodes. However, the present invention is not limited to this, and the opposite electrodes 24 and 130 may be configured with two or more electrodes, respectively. The CPU 91 instructs to specify a pressing operation direction based on voltage that is varied by electrical resistance of each of the groups of electrodes 12 and so on. However, the present invention is not limited to this, and the CPU 91 may instruct to specify the pressing operation direction based on a current value when current is varied by electrical resistance. The CPU 91 may instruct to specify the pressing operation direction based on only the various values of a voltage value or current value without generating a vector and combining several vectors. For example, the CPU 91 instructs to specify each direction, which connect the center of inside region of the looped sensor 11 and a group of electrodes with the minimum voltage value or the connect the center of inside region of the looped sensor 11 and a group of electrodes with the maximum current value, as the pressing operation direction.

The multidirectional input member and the electrical device being thus described, it will be apparent that the same may be varied in many ways. Such variations are not to be regarded as a departure from the sprit and scope of the invention, and all such modifications as would be apparent to one of ordinary skill in the art are intended to be included within the scope of the following claims.

What is claimed is:

1. A multidirectional input member comprising:
a base plate;
a looped sensor that includes a plurality of groups of non-contacting electrodes configured in a loop and that is formed on the base plate; and
an operation plate located opposite to the base plate, wherein
the operation plate has a first loop-shaped protrusion that is located at a plane opposite to the base plate, that is protruded toward the base plate side, that is opposite to the looped sensor, and that is configured with a resistant rubber member,
the first protrusion has a configuration in which its sectional area of a plane parallel to the base plate is tapered in the direction from the operation plate side toward the base plate side,
the base plate has at least one group of non-contacting electrodes at an inside region of the looped sensor, and
the operation plate has a conducting second protrusion at a location that contacts the at least one group of electrodes in a plane opposite to the base plate.

2. The multidirectional input member according to claim 1, further comprises;
a key mat that has a larger area than the operation plate is fixed in a plane of the operation plate;
the plane being in a side opposite to the base plate; and
a spacer existing between the outer circumference region of the operation plate in the key mat and the base plate.

3. The multidirectional input member according to claim 1, further comprises;
a third protrusion provided between the first protrusion and the second protrusion within a plane of the operation plate opposite to the base plate; and
the third protrusion is protruded more toward the base plate side than at least the second protrusion.

4. The multidirectional input member according to claim 3, wherein the third protrusion is a looped protrusion surrounding the second protrusion.

5. The multidirectional input member according to claim 1, wherein the looped sensor is in a quadrangular frame shape, has a first electrode, second electrode, third electrode, and fourth electrode that are respectively divided in four directions and has an opposite non-contacting electrode that is located opposite to the first electrode, the second electrode, the third electrode, and the fourth electrode.

6. The multidirectional input member according to claim 5, wherein the opposite electrode performs as one common electrode for the first electrode, the second electrode, the third electrode, and the fourth electrode.

7. The multidirectional input member according to claim 1, wherein the looped sensor is in a quadrangular frame shape, and a diagonal line of at least one quadrangular corner part is a border between the two adjacent groups of the electrodes.

8. The multidirectional input member according to claim 1, wherein at least one of the groups of the electrodes has an alternated tooth configuration in which several multi-tooth electrodes are located in parallel to each other and alternate without contacting each other.

9. An electrical device comprising:

a multidirectional input member that has a base plate, a looped sensor in which a plurality of groups of non-contacting electrodes configured in a loop and that is formed on the base plate, and an operation plate located opposite to the base plate, wherein the operation plate has a first loop-shaped protrusion that is located at a plane opposite to the base plate, that is protruded toward the base plate side, that is opposite to the looped sensor, and that is configured with a resistant rubber member, and the first protrusion has a configuration in which its sectional area of a plane parallel to the base plate is tapered in the direction from the operation plate side toward the base plate side; and a control unit that is configured to specify a pressing location of the first protrusion based on electrical resistance of each of the groups of the electrodes that is changed by contact between the first protrusion and the plurality of groups of electrodes and a voltage value or current value that varies by the electrical resistance, wherein the base plate has at least one group of non-contacting electrodes at an inside region of the looped sensor, the operation plate has a conducting second protrusion at a location that contacts the at least one group of electrodes in a plane opposite to the base plate, and the control unit detects input of a switch by contacting between the second protrusion and the at least one group of electrodes.

10. The electrical device according to claim 9, wherein the control unit comprises a vector generation unit that generates a vector corresponding to the voltage value or the current value of each of the groups of the electrodes, and a vector composition unit that combines several vectors when the vector generation unit generates several vectors.

\* \* \* \* \*